United States Patent [19]
Kotvas et al.

[11] Patent Number: 5,825,076
[45] Date of Patent: Oct. 20, 1998

[54] INTEGRATED CIRCUIT NON-ETCH TECHNIQUE FOR FORMING VIAS IN A SEMICONDUCTOR WAFER AND A SEMICONDUCTOR WAFER HAVING VIAS FORMED THEREIN USING NON-ETCH TECHNIQUE

[75] Inventors: Joseph C. Kotvas; Saptharishi Sriram, both of Monroeville, Pa.

[73] Assignee: Northrop Grumman Corporation, Los Angeles, Calif.

[21] Appl. No.: 685,884

[22] Filed: Jul. 25, 1996

[51] Int. Cl.⁶ .......................... H01L 21/463; H01L 21/78
[52] U.S. Cl. .......................... 257/622; 257/618; 257/620; 257/48; 437/226; 437/203
[58] Field of Search ...................................... 257/620, 622, 257/48, 618, 623, 627, 628; 437/226, 203

[56] References Cited

U.S. PATENT DOCUMENTS

| | | | |
|---|---|---|---|
| 4,839,300 | 6/1989 | Kawahara et al. | 257/620 |
| 5,314,844 | 5/1994 | Imamura | 437/226 |
| 5,532,174 | 7/1996 | Corrigan | 437/226 |

FOREIGN PATENT DOCUMENTS

| | | | |
|---|---|---|---|
| 58-123738 | 7/1983 | Japan | 257/622 |
| 58-125836 | 7/1983 | Japan | 257/622 |
| 59-43557 | 3/1984 | Japan | 257/622 |
| 5-259274 | 10/1993 | Japan | 257/620 |

Primary Examiner—Tom Thomas
Assistant Examiner—David B. Hardy
Attorney, Agent, or Firm—Walter G. Sutcliff

[57] ABSTRACT

A semiconductor wafer and a method of forming vias in a semiconductor wafer having opposite first and second planar surfaces and predetermined thickness includes forming a plurality of first channels of first predetermined depth along a first direction in the first planar surface of the semiconductor wafer and forming a plurality of second channels of second predetermined depth along a second direction in the second planar surface of the semiconductor wafer. The first and second predetermined depths of the channels are selected such that vias are formed through the semiconductor wafer. The channels may be formed by saw cutting or scribing the planar surfaces of the semiconductor wafer. A plurality of circuit devices may be formed on the first planar surface of the semiconductor wafer prior to forming the plurality of first and second channels. A metallic layer is deposited within the vias and on the first and second planar surfaces to provide electrical connection between the circuit devices and the second planar surface of the semiconductor wafer through the vias.

20 Claims, 4 Drawing Sheets

FIG.2
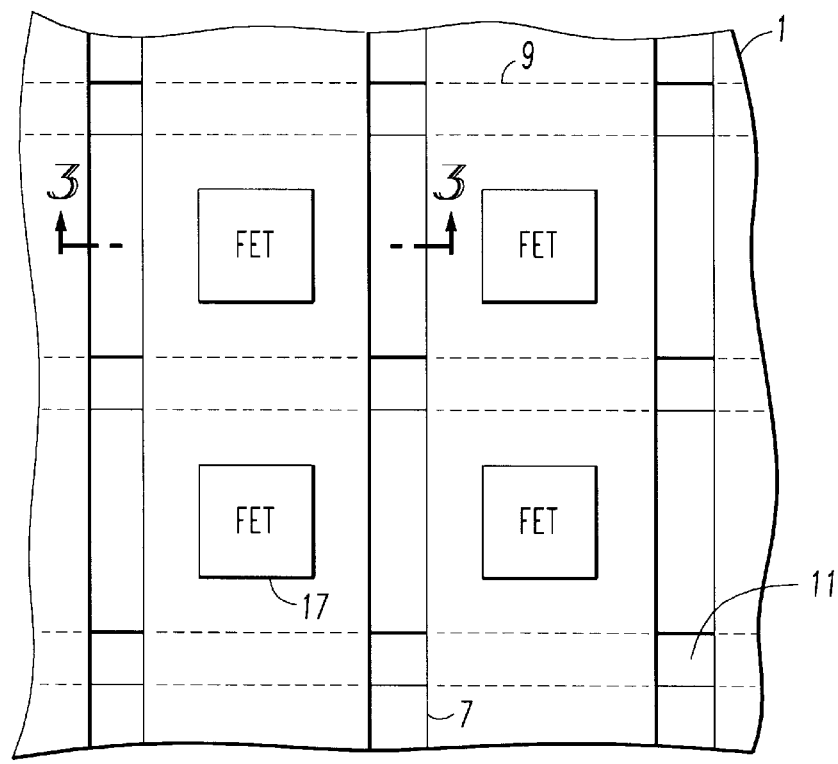
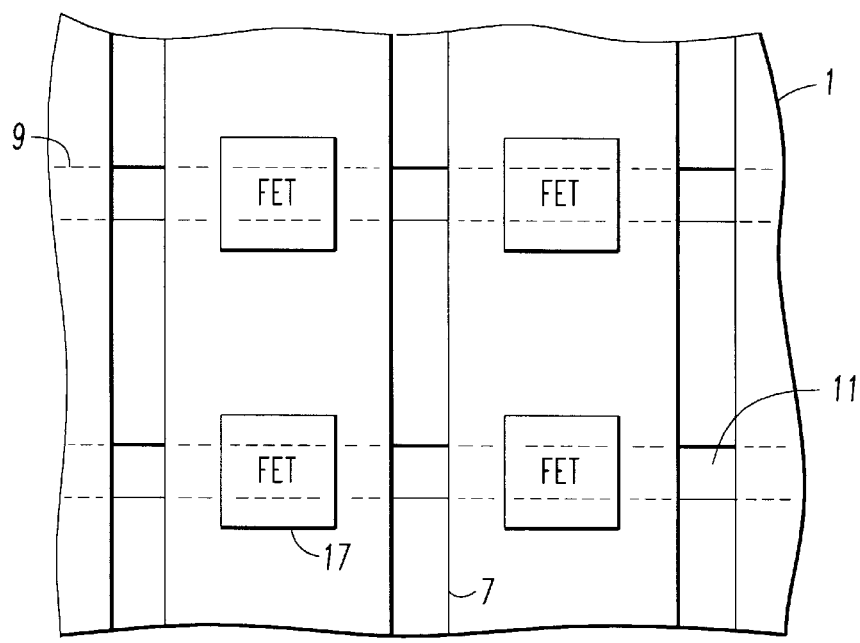
FIG.4

INTEGRATED CIRCUIT NON-ETCH TECHNIQUE FOR FORMING VIAS IN A SEMICONDUCTOR WAFER AND A SEMICONDUCTOR WAFER HAVING VIAS FORMED THEREIN USING NON-ETCH TECHNIQUE

FIELD OF THE INVENTION

The present invention relates to a method of forming vias in a semiconductor wafer and a semiconductor wafer having vias formed therein in accordance with the described method. More specifically, the present invention relates to a low-cost, non-etch technique for manufacturing vias in a semiconductor wafer to enable electrical connection between opposing first and second planar surfaces of the semiconductor wafer.

DESCRIPTION OF THE BACKGROUND ART

In microwave transistors and integrated circuits, it is often required to establish a low inductance ground connection between circuits formed on a top planar surface of a semiconductor wafer and a grounded bottom planar surface of the semiconductor wafer. A low inductance ground connection is especially important for high power microwave devices such as field effect transistors since common source inductance can significantly degrade gain and may lead to signal level variations across the device.

A conventional integrated circuit manufacturing technique used to obtain low inductance ground connections comprises forming metallized vias from a top planar surface of the semiconductor wafer to a bottom planar surface of the semiconductor wafer. Typically, the vias are formed using wet chemical etching, dry etching or laser drilling processing techniques. However, wet chemical etching has the undesirable characteristic of introducing significant undercut and is also a difficult process to perform in a manufacturing environment. Moreover, wet chemical etching of semiconductor materials such as silicon carbide is very difficult due to the chemical inertness of the semiconductor material. Dry etching techniques such as reactive ion etching have a slow etch rate. On the other hand, laser drilling of vias increases manufacturing cost and is relatively time-consuming.

SUMMARY OF THE INVENTION

Accordingly, an object of the present invention is to provide a low cost, no etch technique for manufacturing vias in a semiconductor wafer.

It is a further object of the present invention to provide a method of manufacturing vias in a semiconductor wafer to establish a low inductive ground connection between circuit devices formed in a top planar surface of the semiconductor wafer and a bottom planar surface of the semiconductor wafer.

These and other objects of the present invention are fulfilled by providing a method of forming vias in a semiconductor wafer having opposite first and second planar surfaces and predetermined thickness comprising the steps of forming a plurality of first channels of first predetermined depth along a first direction in the first planar surface of the semiconductor wafer; and forming a plurality of second channels of second predetermined depth along a second direction in the second planar surface of the semiconductor wafer, wherein the first and second directions are nonparallel. In a preferred embodiment, at least one of the first and second predetermined depths of the plurality of first and second channels are greater than half the predetermined wafer thickness such that vias are formed through the semiconductor wafer. In a further preferred embodiment, the method comprises the further step of depositing a metallic layer within the vias and on the first and second planar surfaces to provide electrical connection between the first and second planar surfaces of the semiconductor wafer through the vias.

The above-noted objects and other objects may also be fulfilled by providing a connection method for a semiconductor wafer having opposite first and second planar surfaces and predetermined wafer thickness comprising the steps of processing the semiconductor wafer to form circuit devices on the first planar surface of the semiconductor wafer; forming a plurality of first channels of first predetermined depth along a first direction in the first planar surface of the semiconductor wafer; forming a plurality of second channels of the second predetermined depth along a second direction in the second planar surface of the semiconductor wafer and depositing a metallic layer within the vias and on the first and second planar surfaces of the semiconductor wafer to provide electrical connection between the circuit devices and the second planar surface of the semiconductor wafer through the vias. The first and second directions are nonparallel. In a preferred embodiment, at least one of the first and second predetermined depths of the plurality of first and second channels are greater than half the predetermined wafer thickness such that the vias are formed through the semiconductor wafer.

The above-noted objects and other objects may also be fulfilled by providing a semiconductor wafer having predetermined wafer thickness and opposing first and second planar surfaces comprising a plurality of first channels of first predetermined depth formed in the first planar surface of the semiconductor wafer along a first direction and a plurality of second channels of second predetermined depth formed in the second planar surface of the semiconductor wafer in a second direction. The first and second directions are non-parallel. In a preferred embodiment, at least one of the first and second predetermined depths of the plurality of first and second channels are greater than half the predetermined wafer thickness such that vias are formed through the semiconductor wafer. In a further preferred embodiment, the first direction is perpendicular to the second direction. In a still further embodiment, the semiconductor wafer further includes a metallic layer deposited within the vias and on the first and second planar surfaces of the semiconductor wafer to provide electrical connection between the first and second planar surfaces.

The above described techniques enable metallization of the entire semiconductor wafer while intact. Maintaining the semiconductor wafer as a whole at this stage of processing prior to metallization enables reduction in cost and processing time since slicing of the wafer into plural individual chips is avoided.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitative of the present invention and wherein:

FIG. 2 illustrates a top plan view of a semiconductor wafer having vias formed therethrough and circuit devices formed thereon in accordance with an embodiment of the present invention;

FIG. 4 illustrates a top plan view of a semiconductor wafer having vias formed therethrough and circuit devices formed thereon in accordance with a further embodiment of the present invention.

DETAILED DESCRIPTION OF THE PREFERRED EMBODIMENTS

Figure 1:
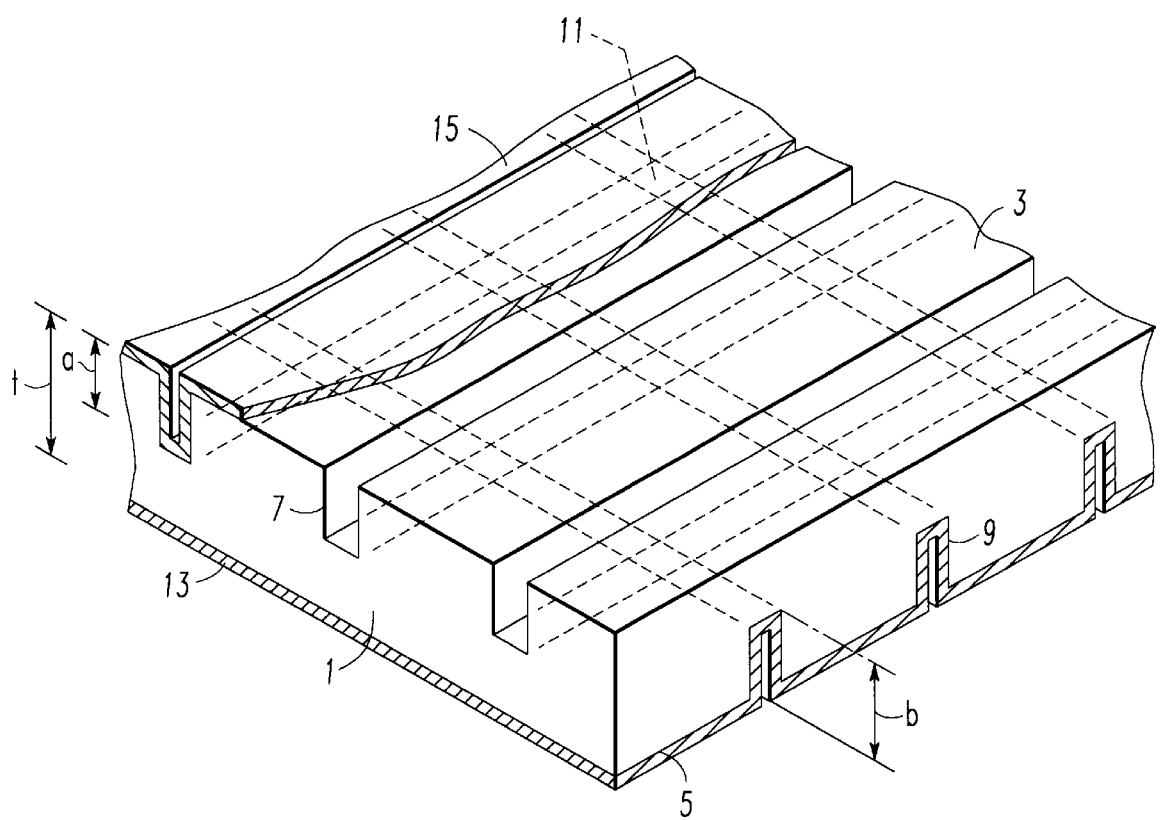
FIG. 1 is a perspective view of a semiconductor wafer having vias formed therethrough in accordance with an embodiment of the present invention.

FIG. 1 illustrates a perspective view of a semiconductor wafer processed in accordance with a preferred embodiment of the present application. Semiconductor wafer 1 may be a semiconductor material such as silicon carbide or the like, but is not necessarily limited thereto. For example, semiconductor wafer 1 may be gallium arsenide semiconductor material. Semiconductor wafer 1 is illustrated as including an upper planar surface 3 and an opposing lower planar surface 5.

Formed within upper planar surface 3 of semiconductor wafer 1 are a plurality of parallel channels 7. Formed within lower planar surface 5 of semiconductor wafer 1 are a plurality of parallel channels 9. Channels 7 and 9 may be formed by cutting or sawing semiconductor wafer 1 using a diamond saw, carborundum saw or the like. In an alternative embodiment, channels 7 and 9 may be formed by scribing semiconductor wafer 1. In the FIG. 1 embodiment, the plurality of channels 7 are formed in semiconductor wafer 1 perpendicular with respect to the plurality of channels 9. However, it is to be understood that the plurality of channels 7 are not necessarily limited as being perpendicular with respect to the plurality of channels 9. For instance, the plurality of channels 9 may be formed in lower planar surface 5 of semiconductor wafer 1 to diagonally intersect the plurality of channels 7 oriented as illustrated in FIG. 1.

As illustrated in FIG. 1, semiconductor wafer 1 has wafer thickness t. In a preferred embodiment, channel depth a of the plurality of channels 7 and channel depth b of the plurality of channels 9 are both slightly greater than ½ wafer thickness t (½ t) such that vias or throughholes 11 are formed in semiconductor wafer 1 at respective intersections of channels 7 and channels 9. In an alternative embodiment, channel depth a of channels 7 may be substantially greater than ½ wafer thickness t (½ t) while channel depth b of channels 9 is substantially less than ½ wafer thickness t (½ t). For example, channel depth a of channels 7 may be ⅔ wafer thickness t (⅔ t) and channel depth b of channels 9 may be slightly greater than ⅓ wafer thickness t (⅓ t) such that vias 11 are formed in semiconductor wafer 1.

Semiconductor wafer 1 is illustrated as including metallization layer 13 formed on lower planar surface 5 and within channels 9. In a preferred embodiment, metallization layer 13 may include a layer of titanium-gold evaporation sputtered onto lower planar surface 5 and within channels 9 and a layer of gold plated on to the layer of titanium-gold to provide a final metallization layer thickness. It is however to be understood that the metallization layer is not necessarily limited as a gold-plated layer on a sputtered gold-titanium layer. Any appropriate metallization material or process may be used as would be understood by one of ordinary skill. In a similar manner, metallization layer 15 is formed on upper planar surface 3 of semiconductor wafer 1 and within channels 7. Conductivity is realized between metallization layer 13 formed on lower planar surface 5 of semiconductor wafer 1 and metallization layer 15 formed on upper planar surface 3 through vias 11.

As described previously, circuit devices are typically formed on the upper planar surface of a semiconductor wafer and a grounded metallization layer is formed on the lower planar surface of the semiconductor wafer. It is to be understood however that metallization layer 13 of semiconductor wafer 1 is not necessarily limited as coupled to ground and may be coupled to any desired potential.

FIG. 2 illustrates a top view of a semiconductor wafer 1 processed in accordance with an embodiment of the present invention, prior to metallization. A plurality of channels 7 formed in the upper planar surface of semiconductor wafer 1 are indicated as solid lines. A plurality of channels 9 formed in a lower planar surface of semiconductor wafer 1 are indicated as dashed ghost lines. Vias 11 are illustrated as formed at respective intersections of channels 7 and 9. A plurality of circuit devices are illustrated as field effect transistors in this particular preferred embodiment. The field effect transistors (FETs) comprise n-channel portions 17 formed on the upper planar surface of semiconductor wafer 1, as will be subsequently described. It is to be understood however that the particular circuit devices are not necessarily limited as field effect transistors and that a variety of circuit devices may be formed on semiconductor wafer 1. Moreover, the circuit devices may be formed within an epitaxial layer of semiconductor wafer 1 as will be described hereinafter or may be discrete components mounted upon semiconductor wafer 1.

Figure 3A:
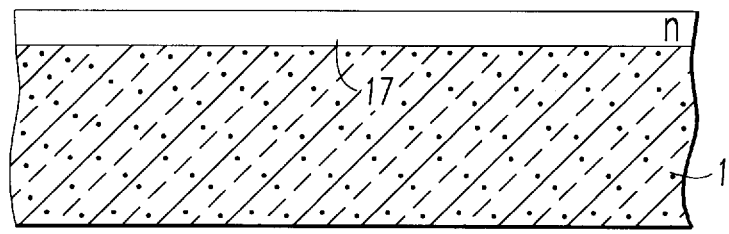
FIGS. 3(a)–3(h) illustrate cross-sectional processing views of the semiconductor wafer illustrated in FIG. 2 taken along sectional view line 3—3.
Figure 3B:
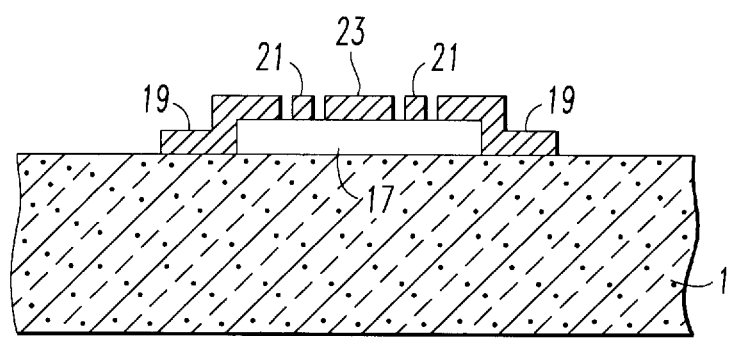
Figure 3C:
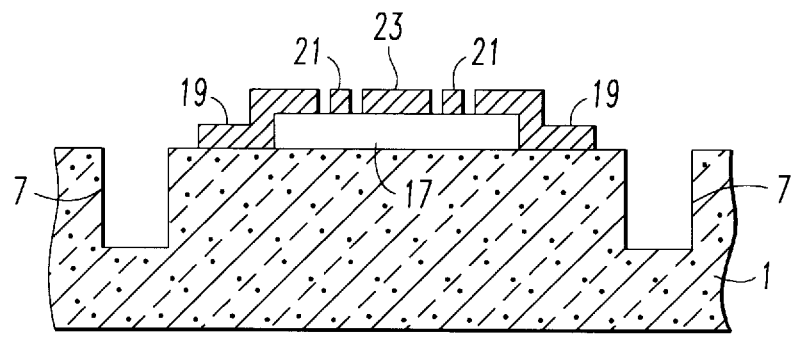
Figure 3D:
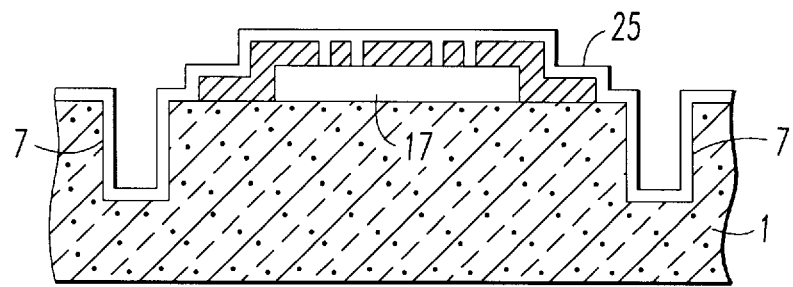
Figure 3E:
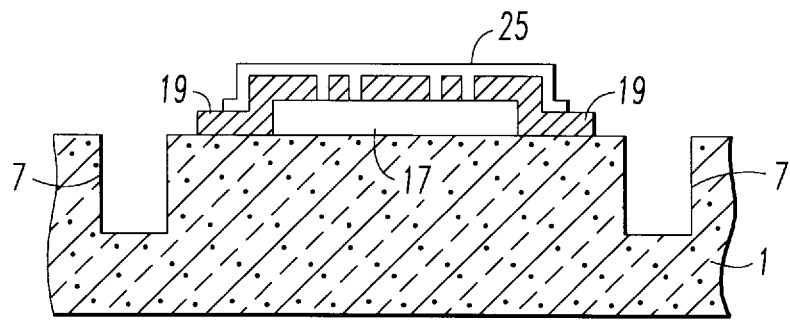
Figure 3F:
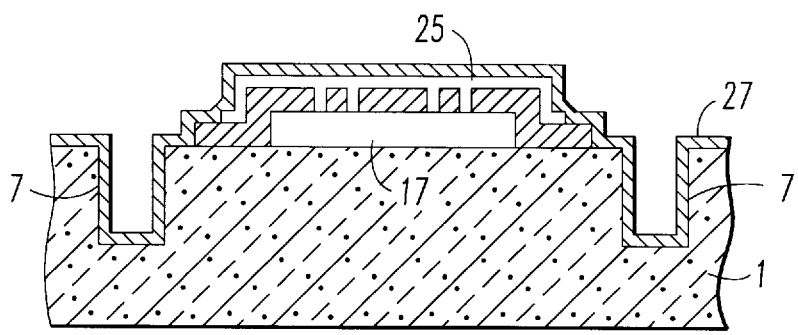

A method of forming vias in a semiconductor wafer having field effect transistors formed thereon according to an embodiment of the present invention will now be described with respect to FIGS. 3(a)–3(h). FIG. 3(a) illustrates high resistivity substrate semiconductor wafer 1 having a n-channel layer 17 grown thereon by epitaxial processing. It is to be understood that epitaxial layer 17 is designated as n-type for purposes of description only and that epitaxial layer 17 may be p-type material in the alternative. FIG. 3(b) illustrates epitaxial layer 17 which has been etched to form a mesa shaped n-channel portion of a field effect transistor. Metallic source contacts 19, gate contacts 21 and drain contact 23 are then formed on mesa 17 by a metallization process in a conventional manner. The metallic contacts may be titanium-gold but are not limited thereto. FIG. 3(c) illustrates channels 7 formed within an upper planar surface of semiconductor wafer 1 by either saw cutting or scribing as previously described. It is to be understood that channels 9 are formed in a lower planar surface of semiconductor wafer 1, although not shown in this particular cross-sectional view.

In FIG. 3 (d), a photoresist layer 25 is coated over the entire upper planar surface of semiconductor wafer 1, including over the metallic contacts and within channels 7. Thereafter, exposure of photoresist 25 is performed such that all of photoresist 25 is removed except over the metallic contacts. However, as illustrated in FIG. 3(e), the photoresist 25 is removed from corresponding end portions of source contacts 19 such that these corresponding end portions of source contacts 19 are left exposed. Thereafter, metallization layer 27 is deposited upon the upper planar surface of semiconductor wafer 1, including within channels 7, by sputtering or the like as illustrated in FIG. 3(f). Metallization layer 27 may be titanium-gold or a suitable alternative metal.

Figure 3G:
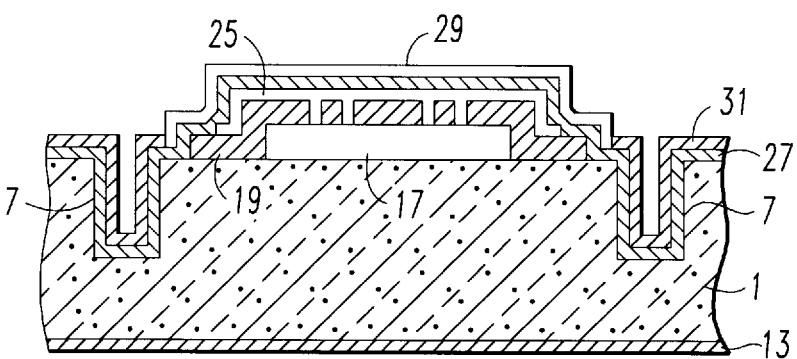
Figure 3H:
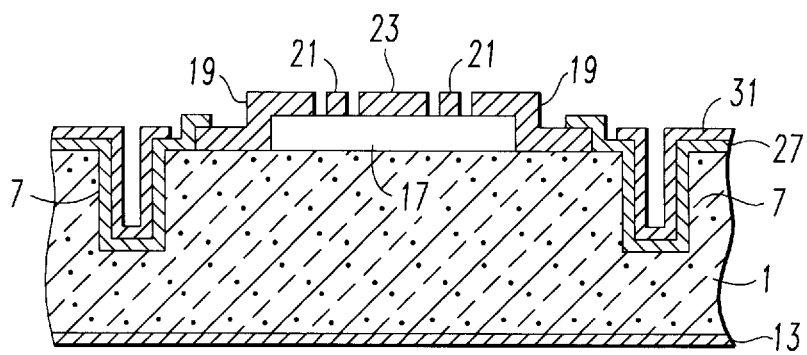

Subsequently, a second photoresist layer 29 is formed over the entire surface of semiconductor wafer 1 on metallic layer 27. Photoresist layer 29 is etched in a known manner to be retained on metallization layer 27 in the vicinity of mesa shaped n-channel portion 17 extending over the area corresponding to source contacts 19, as illustrated in FIG. 3(g). Photoresist layer 29 is used as a mask during a subsequent gold plating process for forming plated gold layer 31 on metallization layer 27. Metallization layer 13 may then be formed on a lower planar surface 5 of semiconductor wafer 1. It is to be understood that metallization layer 27 and gold plated layer 31 may be considered as corresponding to metallization layer 15 illustrated in FIG. 1. Moreover, metallization layer 13 may be formed as including a gold plated layer formed on a sputtered titanium-gold layer. Finally, photoresist layers 29 and 25 are sequentially removed as illustrated in FIG. 3(h) such that a portion of metallization layer 27 contacts source contacts 19 and such that both metallization layer 27 and gold plated layer 31 are formed within the vias and on the peripheral portions of the upper planar surface of semiconductor wafer 1.

Accordingly, in a preferred embodiment wherein metallization layer 13 on the lower planar surface of semiconductor wafer 1 is grounded, and wherein mesa shaped n-channel portions 17 are field effect transistors, sources 19 of the field effect transistors are effectively grounded by virtue of metallization layer 27, vias 11 and metallization layer 13.

The processing steps illustrated in FIGS. 3(a)–3(h) describe mesa portion 17 of semiconductor wafer 1 as n-type material. However, mesa portion 17 of semiconductor wafer 1 may be p-type material and semiconductor wafer 1 may be n-type material. In a preferred embodiment, the wafer thickness t of semiconductor wafer 1 may be approximately 18 mils (0.457 mm) and channel depths a and b of channels 7 and 9 may be slightly greater than ½ wafer thickness t, or approximately slightly greater than 9 mils (0.229 mm). Although processing is described in FIGS. 3(a)–3(h) with respect to n-channel portions 17 of the circuit devices being formed in an epitaxial layer, it is to be understood that discrete circuit components may be mounted on the upper planar surface of semiconductor wafer 1 after metallization. The discrete circuit components may be mounted onto the metallization layer using solder or conductive epoxy as would be understood by one of ordinary skill.

In FIG. 2, the n-channel portion 17 of the circuit devices are formed on the upper planar surface of semiconductor wafer 1 between pairs of channels 7 and above portions of semiconductor wafer 1 which are between pairs of channels 9 formed in the lower planar surface of semiconductor wafer 1. In an alternative embodiment illustrated in FIG. 4, n-channel portions 17 of the circuit devices are formed on the upper planar surface of semiconductor wafer 1 between pairs of channels 7 and above channels 9 formed in the lower planar surface of semiconductor wafer 1.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A connection method for a semiconductor wafer having opposite first and second planar surfaces and predetermined wafer thickness, the connection method comprising the steps of:
   a) processing the semiconductor wafer to form circuit devices on the first planar surface of the semiconductor wafer;
   b) forming a plurality of first channels of first predetermined depth along a first direction in the first planar surface of the semiconductor wafer;
   c) forming a plurality of second channels of second predetermined depth along a second direction in the second planar surface of the semiconductor wafer,
   the first and second directions being nonparallel and at least one of the first and second predetermined depths of the plurality of first and second channels being greater than half the predetermined wafer thickness such that vias are formed through the semiconductor wafer; and
   d) depositing a metallic layer within the vias and on the first and second planar surfaces of the semiconductor wafer to provide electrical connection between the circuit devices and the second planar surface of the semiconductor wafer through the vias.

2. The connection method for a semiconductor wafer of claim 1, wherein said step c) comprises forming the plurality of second channels in the second direction perpendicular to the first direction.

3. The connection method for a semiconductor wafer of claim 1, wherein said steps b) and c) comprise cutting the semiconductor wafer to form the plurality of first and second channels.

4. The connection method for a semiconductor wafer of claim 1, wherein said steps b) and c) comprise scribing the semiconductor wafer to form the plurality of first and second channels.

5. The connection method for a semiconductor wafer of claim 1, wherein the first and second predetermined depths of the plurality of first and second channels are greater than half the predetermined wafer thickness.

6. The connection method for a semiconductor wafer of claim 1, wherein said step a) comprises processing the semiconductor wafer to form the circuit devices on respective corresponding portions of the first planar surface to be located over respective ones of the plurality of second channels.

7. The connection method for a semiconductor wafer of claim 1, wherein said step a) comprises processing the semiconductor wafer to form the circuit devices on respective corresponding portions of the first planar surface to be located over corresponding portions of the second planar surface between pairs of the plurality of second channels.

8. The connection method for a semiconductor wafer of claim 1, wherein the semiconductor wafer comprises silicon carbide.

9. A method of forming vias in a semiconductor wafer having opposite first and second planar surfaces and predetermined wafer thickness, the method comprising the steps of:
   a) forming a plurality of first channels of first predetermined depth along a first direction in the first planar surface of the semiconductor wafer; and
   b) forming a plurality of second channels of second predetermined depth along a second direction in the second planar surface of the semiconductor wafer, the first and second directions being nonparallel and at least one of the first and second predetermined depths of the plurality of first and second channels being greater than half the predetermined wafer thickness such that the vias are formed through the semiconductor wafer.

10. The method of forming vias in a semiconductor wafer of claim 9, further comprising the step of:

c) depositing a metallic layer within the vias and on the first and second planar surfaces to provide electrical connection between the first and second planar surfaces of the semiconductor wafer through the vias.

11. The method of forming vias in a semiconductor wafer of claim 9, wherein said step b) comprises forming the plurality of second channels in the second direction perpendicular to the first direction.

12. The method of forming vias in a semiconductor wafer of claim 9, wherein said steps a) and b) comprise cutting the semiconductor wafer to form the first and second channels.

13. The method of forming vias in a semiconductor wafer of claim 9, wherein said steps a) and b) comprise scribing the semiconductor wafer to form the first and second channels.

14. The method of forming vias in a semiconductor wafer of claim 9, wherein the first and second predetermined depths of the plurality of first and second channels are greater than half the predetermined wafer thickness.

15. The method of forming vias of claim 9, wherein the semiconductor wafer comprises silicon carbide.

16. A semiconductor wafer having predetermined wafer thickness and opposing first and second planar surfaces comprising:

a plurality of first channels of first predetermined depth formed in the first planar surface of the semiconductor wafer along a first direction; and a plurality of second channels of second predetermined depth formed in the second planar surface of the semiconductor wafer in a second direction, said first and second directions being non-parallel and at least one of said first and second predetermined depths of said plurality of first and second channels being greater than half the predetermined wafer thickness such that vias are formed through the semiconductor wafer.

17. The semiconductor wafer of claim 16, wherein said first direction is perpendicular to said second direction.

18. The semiconductor wafer of claim 16, wherein said plurality of first and second channels are saw-cut channels.

19. The semiconductor wafer of claim 16, wherein said plurality of first and second channels are scribed channels.

20. The semiconductor wafer of claim 16, further comprising a metallic layer deposited within the vias and on the first and second planar surfaces of the semiconductor wafer to provide electrical connection between the first and second planar surfaces.

* * * * *